(12) United States Patent
Kwon et al.

(10) Patent No.: US 11,700,762 B2
(45) Date of Patent: **\*Jul. 11, 2023**

(54) ORGANIC LIGHT-EMITTING APPARATUS

(71) Applicant: SAMSUNG DISPLAY CO., LTD., Yongin-si (KR)

(72) Inventors: Younggil Kwon, Yongin-si (KR); Sungwoong Kim, Yongin-si (KR); Jinbaek Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/516,494

(22) Filed: Nov. 1, 2021

(65) Prior Publication Data
US 2022/0052305 A1     Feb. 17, 2022

Related U.S. Application Data

(63) Continuation of application No. 16/894,631, filed on Jun. 5, 2020, now Pat. No. 11,165,050, which is a (Continued)

(30) Foreign Application Priority Data

Feb. 2, 2016   (KR) .......................... 10-2016-0012908
Jan. 5, 2017   (KR) .......................... 10-2017-0002068

(51) Int. Cl.
*H10K 71/00*     (2023.01)
*H10K 50/805*    (2023.01)
(Continued)

(52) U.S. Cl.
CPC .......... *H10K 71/00* (2023.02); *H10K 50/805* (2023.02); *H10K 50/824* (2023.02); (Continued)

(58) Field of Classification Search
CPC . H01L 51/56; H01L 51/5203; H01L 51/5228; H01L 51/0023; H01L 51/0011;
(Continued)

(56) References Cited

U.S. PATENT DOCUMENTS 8,778,600 B2   7/2014  Suh et al.
8,963,170 B2   2/2015  Yokoyama et al.
(Continued)

FOREIGN PATENT DOCUMENTS

CN   102169959 A   8/2011
CN   102738406 A   10/2012
(Continued)

*Primary Examiner* — Alonzo Chambliss
(74) *Attorney, Agent, or Firm* — Lewis Roca Rothgerber Christie LLP

(57) ABSTRACT

A method of manufacturing an organic light-emitting display apparatus includes: forming a lift-off layer on a substrate including a first electrode, the lift-off layer including a fluoropolymer; forming a pattern layer on the lift-off layer; etching the lift-off layer between patterns of the pattern layer by utilizing a first solvent to expose the first electrode; forming an organic functional layer on the first electrode and the pattern layer, the organic functional layer including an emission layer; removing remaining portions of the lift-off layer by utilizing a second solvent; and forming a second electrode on the organic functional layer.

20 Claims, 25 Drawing Sheets

Related U.S. Application Data continuation of application No. 16/287,852, filed on Feb. 27, 2019, now Pat. No. 10,680,212, which is a continuation of application No. 15/410,479, filed on Jan. 19, 2017, now Pat. No. 10,243,175.

(51) Int. Cl.

| | | |
|---|---|---|
| *H10K 50/824* | (2023.01) | |
| *H10K 59/35* | (2023.01) | |
| *H10K 59/122* | (2023.01) | |
| *H10K 59/173* | (2023.01) | |
| *H10K 71/16* | (2023.01) | |
| *H10K 71/20* | (2023.01) | |
| *H10K 59/12* | (2023.01) | |

(52) U.S. Cl.
CPC ......... *H10K 59/122* (2023.02); *H10K 59/173* (2023.02); *H10K 59/35* (2023.02); *H10K 71/166* (2023.02); *H10K 71/221* (2023.02); *H10K 71/621* (2023.02); *H10K 59/1201* (2023.02)

(58) Field of Classification Search
CPC .............. H01L 51/0016; H01L 51/5016; H01L 27/3246; H01L 27/3211; H01L 27/3283; H01K 71/00; H01K 71/166; H01K 71/62; H01K 71/221; H01K 50/805; H01K 50/824; H01K 59/122; H01K 59/35; H01K 59/173

See application file for complete search history.

(56) References Cited

U.S. PATENT DOCUMENTS

| | | |
|---|---|---|
| 9,547,252 B2 | 1/2017 | Mizuno et al. |
| 9,614,015 B2 | 4/2017 | Park et al. |
| 9,768,384 B2 | 9/2017 | Kwon |
| 9,806,277 B2 | 10/2017 | Jeon et al. |
| 9,899,636 B2 | 2/2018 | Defranco et al. |
| 10,134,991 B2 | 11/2018 | Choi et al. |
| 10,243,175 B2 | 3/2019 | Kwon et al. |
| 10,431,744 B2 | 10/2019 | Kwon et al. |
| 10,680,212 B2 | 6/2020 | Kwon et al. |
| 11,165,050 B2 * | 11/2021 | Kwon ................ H01L 27/3211 |
| 2004/0079940 A1 | 4/2004 | Redecker et al. |
| 2005/0088084 A1 | 4/2005 | Cok |
| 2006/0121639 A1 | 6/2006 | Tai et al. |
| 2011/0159252 A1 | 6/2011 | Ober et al. |
| 2011/0171584 A1 | 7/2011 | Suh et al. |
| 2012/0248467 A1 | 10/2012 | Yokoyama et al. |
| 2013/0236999 A1 | 9/2013 | Lee et al. |
| 2013/0264595 A1 | 10/2013 | Hong et al. |
| 2014/0001450 A1 | 1/2014 | Shinotsuka et al. |
| 2014/0127625 A1 | 5/2014 | Defranco et al. |
| 2014/0329354 A1 | 11/2014 | Defranco |
| 2015/0001485 A1 | 1/2015 | Kang |
| 2015/0034923 A1 | 2/2015 | Kim et al. |
| 2015/0060826 A1 | 3/2015 | Matsumoto et al. |
| 2015/0069361 A1 | 3/2015 | Sato et al. |
| 2015/0333116 A1 | 11/2015 | Yamaguchi |
| 2016/0093832 A1 | 3/2016 | Shinotsuka et al. |
| 2016/0155787 A1 | 6/2016 | Lee |
| 2017/0025610 A1 | 1/2017 | Kwon |
| 2017/0062721 A1 | 3/2017 | Kwon |
| 2017/0222147 A1 | 8/2017 | Defranco et al. |
| 2017/0222148 A1 | 8/2017 | Defranco et al. |
| 2017/0250344 A1 | 8/2017 | Choi et al. |
| 2018/0006226 A1 | 1/2018 | Kwon |
| 2018/0040823 A1 | 2/2018 | Kwon |

FOREIGN PATENT DOCUMENTS

| | | |
|---|---|---|
| CN | 105280835 A | 1/2016 |
| CN | 107111254 A | 8/2017 |
| JP | 2004-71547 | 3/2004 |
| KR | 10-2011-0009708 | 1/2011 |
| KR | 10-2011-0082415 | 7/2011 |
| KR | 10-2015-0003567 | 1/2015 |
| TW | 200905402 A | 2/2009 |
| WO | WO 2012/148884 A2 | 11/2012 |
| WO | WO 2013/074617 A1 | 5/2013 |

* cited by examiner

ORGANIC LIGHT-EMITTING APPARATUS

CROSS-REFERENCE TO RELATED APPLICATIONS

This application is a continuation of U.S. patent application Ser. No. 16/894,631, filed Jun. 5, 2020, which is a continuation of U.S. patent application Ser. No. 16/287,852, filed Feb. 27, 2019, now U.S. Pat. No. 10,680,212, which is a continuation of U.S. patent application Ser. No. 15/410,479, filed Jan. 19, 2017, now U.S. Pat. No. 10,243,175, which claims priority to and the benefit of Korean Patent Application No. 10-2016-0012908, filed Feb. 2, 2016 and Korean Patent Application No. 10-2017-0002068, filed Jan. 5, 2017, the entire content of all of which is incorporated herein by reference.

BACKGROUND

1. Field

One or more aspects of example embodiments relate to an organic light-emitting display apparatus and a method of manufacturing an organic light-emitting display apparatus.

2. Description of the Related Art

An organic light-emitting display apparatus includes a hole injection electrode, an electron injection electrode, and an organic emission layer between the hole injection electrode and the electron injection electrode. The organic light-emitting display apparatus is a self-emissive display apparatus, in which holes injected from the hole injection electrode and electrons injected from the electron injection electrode recombine in the organic emission layer and extinguish to emit light. The organic light-emitting display apparatus is considered as the next generation display apparatus owing to its high quality characteristics, such as low power consumption, high brightness, and fast response speeds.

SUMMARY

One or more aspects of example embodiments are directed toward an organic light-emitting display apparatus and a method of manufacturing the organic light-emitting display apparatus, capable of reducing defects and manufacturing costs.

Additional aspects and features will be set forth in part in the description which follows, and in part, will be apparent from the description, or may be learned by practice of the presented embodiments.

According to one or more embodiments of the inventive concept, a method of manufacturing an organic light-emitting display apparatus includes: forming a lift-off layer on a substrate including a first electrode, the lift-off layer including a fluoropolymer; forming a pattern layer on the lift-off layer; etching the lift-off layer between patterns of the pattern layer by utilizing a first solvent to expose the first electrode; forming an organic functional layer on the first electrode and the pattern layer, the organic functional layer including an emission layer; removing remaining portions of the lift-off layer by utilizing a second solvent; and forming a second electrode on the organic functional layer.

The fluoropolymer may include fluorine of about 20 wt % to about 76 wt %.

The pattern layer may be formed by a printing method.

The pattern layer may include a material having a surface energy that is greater than a surface energy of the lift-off layer.

The pattern layer may include a non-fluorine based polymer material.

The pattern layer may include a fluorine-based polymer containing less than 20 wt % of fluorine.

The pattern layer may include: a first pattern layer including a material having a surface energy that is greater than a surface energy of the lift-off layer; and a second pattern layer including a material having a surface energy that is less than the surface energy of the first pattern layer.

The first pattern layer may include a non-fluorine based polymer material, and the second pattern layer may include a surfactant containing fluorine.

The first pattern layer may surround the second pattern layer.

The organic functional layer may further include a hole injection layer, a hole transport layer, an electron transport layer, and/or an electron injection layer.

The organic functional layer may be formed by a deposition process.

The first solvent may include fluorine.

The second solvent may include fluorine.

When the lift-off layer between patterns of the pattern layer is etched, the lift-off layer may form an undercut profile under the pattern layer.

The method may further include: forming a pixel defining layer surrounding edges of the first electrode.

According to one or more embodiments of the inventive concept, a method of manufacturing an organic light-emitting display apparatus includes: forming a plurality of first electrodes on a substrate; performing a first unit process, the performing of the first unit process including: forming a lift-off layer on the substrate including the plurality of first electrodes, the lift-off layer including a fluoropolymer; forming a pattern layer having a set shape on the lift-off layer; etching the lift-off layer between patterns of the pattern layer by utilizing a first solvent to expose first first electrodes from among the plurality of first electrodes; forming a first organic functional layer on the first first electrodes and the pattern layer, the first organic functional layer including an emission layer; and removing remaining portions of the lift-off layer by utilizing a second solvent; performing a second unit process at least once for forming a second organic functional layer on second first electrodes from among the first electrodes that are different from the first first electrodes after the performing of the first unit process, the second organic functional layer being configured to emit light of a different color from that of the first organic function layer; and forming a second electrode after the performing of each of the first unit process and the second unit process.

The light emitted from the first organic functional layer formed through the first unit process and the light emitted from the second organic functional layer formed through the second unit process may be mixed to generate white light.

The forming of the second electrode may include integrally forming the second electrode as a common electrode on a plurality of organic functional layers.

The method may further include forming an auxiliary cathode on each of the first and second organic functional layers respectively formed in each of the first and second unit processes, before the forming of the second electrode.

According to one or more embodiments of the inventive concept, an organic light-emitting display apparatus includes: a substrate; a first electrode on the substrate; an organic functional layer on the first electrode, the organic functional layer including an emission layer; and a second electrode on the organic functional layer. An unevenness of boundary lines of the organic functional layer is greater than an unevenness of boundary lines of the first electrode.

BRIEF DESCRIPTION OF THE DRAWINGS

These and/or other aspects and features will become apparent and more readily appreciated from the following description of the embodiments, taken in conjunction with the accompanying drawings in which.

DETAILED DESCRIPTION

Figure 1:
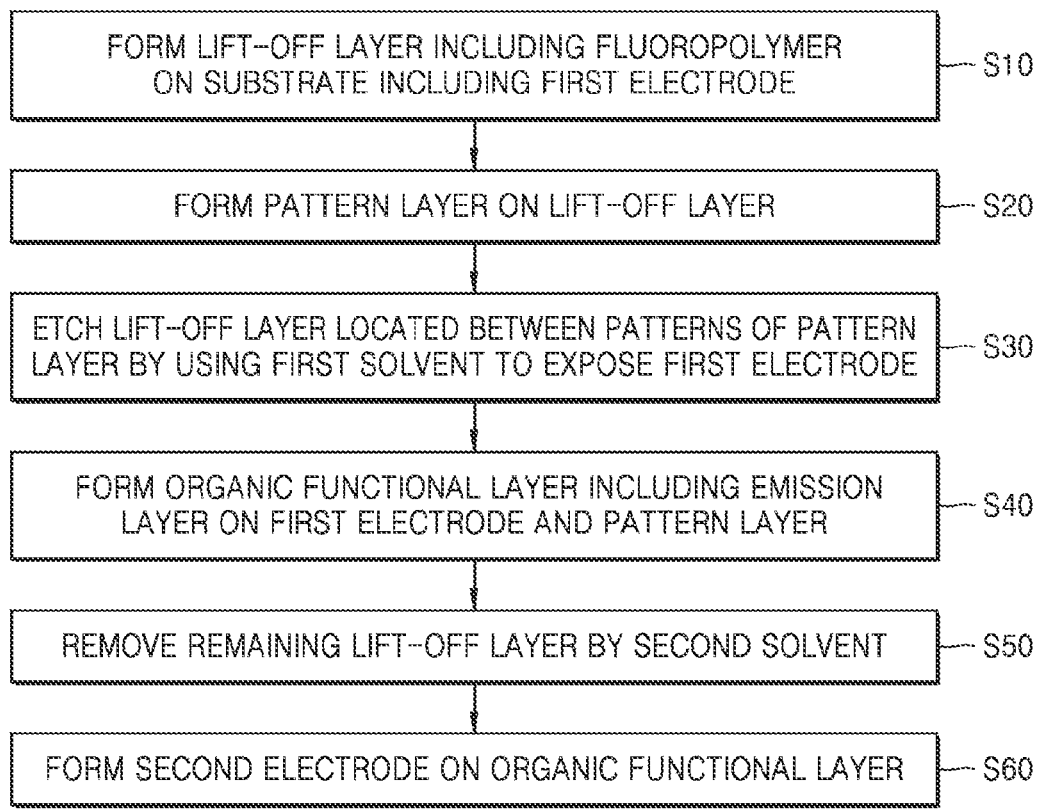
FIG. 1 is a flowchart of a method of manufacturing an organic light-emitting display apparatus according to an embodiment.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the inventive concept refers to "one or more embodiments of the inventive concept." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic flowchart of a method of manufacturing an organic light-emitting display apparatus, according to an embodiment.

Referring to FIG. 1, the method of manufacturing the organic light-emitting display apparatus includes forming a lift-off layer on a substrate including a first electrode, the lift-off layer including a fluorine polymer (e.g., a fluoropolymer) (S10), forming a pattern layer of a certain shape on the lift-off layer (S20), exposing the first electrode by etching the lift-off layer between the pattern layer by using a first solvent (S30), forming an organic functional layer on upper portions of the first electrode and the pattern layer, the organic functional layer including an emission layer (S40), removing the remaining lift-off layer by using a second solvent (S50), and forming a second electrode on the organic functional layer (S60).

The method of manufacturing the organic light-emitting display apparatus and the organic light-emitting display apparatus 1 manufactured by the method according to an embodiment will be described in more detail below with reference to FIGS. 2 through 6E.

Figure 2:
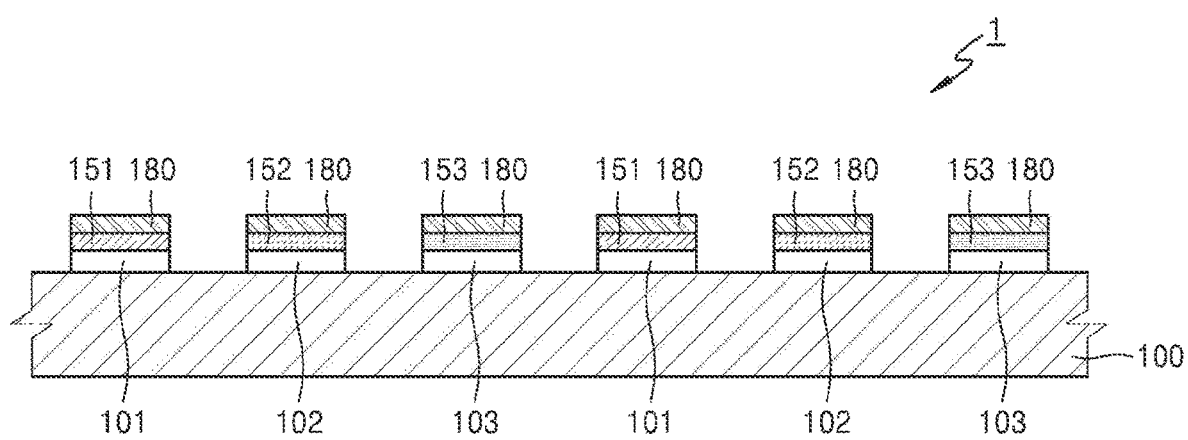
FIG. 2 is a schematic cross-sectional view of an organic light-emitting display apparatus manufactured by the method of FIG. 1.
Figure 3:
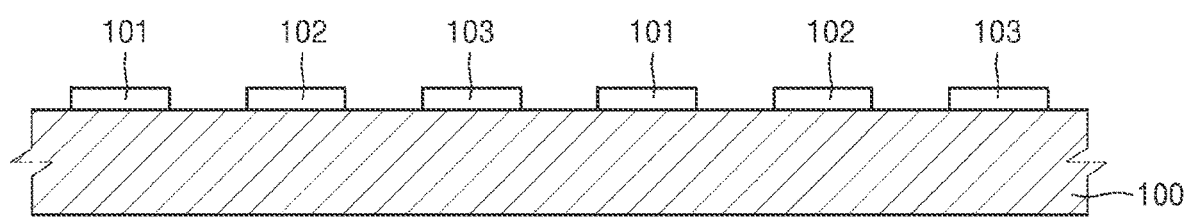
FIG. 3 is a schematic cross-sectional view showing a plurality of anodes formed on a substrate in the method of FIG. 1 according to an embodiment.

FIG. 2 is a schematic cross-sectional view of the organic light-emitting display apparatus 1 manufactured by the method of FIG. 1. FIG. 3 is a schematic cross-sectional view of a process of forming a plurality of anodes on a substrate, in the method of FIG. 1 according to an embodiment, FIGS. 4A to 4E are schematic cross-sectional views of a first unit process in the method of FIG. 1 according to an embodiment, FIGS. 5A to 5E are schematic cross-sectional views of a second unit process in the method of FIG. 1 according to an embodiment, and FIGS. 6A to 6E are schematic cross-sectional views of a third unit process in the method of FIG. 1 according to an embodiment.

Referring to FIG. 2, the organic light-emitting display apparatus 1 manufactured by the method of FIG. 1 includes a plurality of anodes including a first anode 101, a second anode 102, and a third anode 103, on a substrate 100. First to third organic functional layers 151, 152, and 153, each including an emission layer, are located respectively on the first to third anodes 101, 102, and 103. A cathode 180 is disposed on the first to third organic functional layers 151, 152, and 153.

As will be described later, during the process of forming the first to third organic functional layers 151, 152, and 153 on the first to third anodes 101, 102, and 103, a pattern layer 130 (e.g., see FIG. 4D) including a non-fluorine based resin and formed by a printing method on a lift-off layer 120 (e.g., see FIG. 4D) including a fluoropolymer having a low surface energy may function as a deposition mask. In addition, a boundary of the pattern layer 130 (e.g., see FIG. 4D) having poor spreadability may not be uniform, but may be rough. Because the pattern layer 130 (e.g., see FIG. 4D) functions as a deposition mask, a rough shape of the boundary of the pattern layer 130 may affect patterns of the first to third organic functional layers 151, 152, and 153. Consequently, the boundaries of the first to third organic functional layers 151, 152, and 153 may be formed to be rougher than those of the first to third anodes 101, 102, and 103.

Referring to FIG. 3, the plurality of anodes including the first to third anodes 101, 102, and 103 are formed on the substrate 100.

The substrate 100 may include various materials. For example, the substrate 100 may include a glass material or a plastic material. The plastic material may include a material having excellent heat-resisting property and durability, such as polyimide, polyethylenenaphthalate, polyethyleneterephthalate, polyarylate, polycarbonate, polyetherlmide, and/or polyethersulfone.

Although not shown in FIG. 3, a buffer layer for providing a flat surface on the substrate 100 and for preventing impurity elements from infiltrating into the substrate 100 may be further provided. The buffer layer may have a single-layered structure or a multi-layered structure including silicon nitride and/or silicon oxide.

The first to third anodes 101, 102, and 103 are hole injection electrodes, and may include a material having a large work function. The first to third anodes 101, 102, and 103 may each include at least one selected from the group consisting of indium tin oxide, indium zinc oxide, zinc oxide, indium oxide, indium gallium oxide, and aluminium zinc oxide.

Although not shown in FIG. 3, the first to third anodes 101, 102, and 103 may be electrically connected to first to third thin film transistors located between the substrate 100 and the first to third anodes 101, 102, and 103, respectively.

Figure 4A:
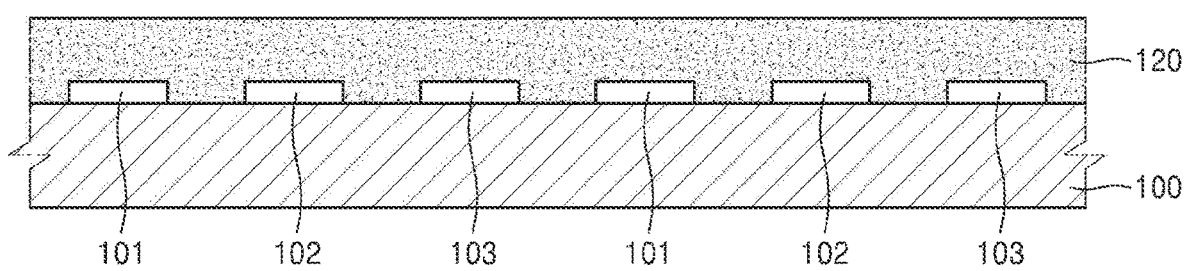
FIGS. 4A-4E are schematic cross-sectional views illustrating a first unit process in the method of FIG. 1 according to an embodiment.

Referring to FIG. 4A, a lift-off layer 120 including a fluoropolymer is formed over the substrate 100, on which the first to third anodes 101, 102, and 103 are formed.

The fluoropolymer included in the lift-off layer 120 may include a polymer containing fluorine of about 20 wt % to about 76 wt %. For example, the fluoropolymer included in the lift-off layer 120 may include polytetrafluoroethylene, polychlorotrifluoroethylene, polydichlorodifluoroethylene, a copolymer of chlorotrifluoroethylene and dicholorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and/or a copolymer of chlorotrifluoroethylene and perfluoroalkylvinylether.

If an amount of fluorine in the fluoropolymer is less than 20 wt %, the fluoropolymer is not soluble in a fluorine-based solvent, and thus, a fluorine-based resin for forming the lift-off layer 120 may not be fabricated. In addition, the amount of fluorine in the fluoropolymer may not exceed 76 wt %, because an amount of fluorine in Teflon that has the largest amount of fluorine among fluoropolymers is not greater than 76 wt %. In the embodiment, the lift-off layer 120 shows excellent tolerance with respect to an organic solvent and excellent solubility with respect to the fluorine-based solvent, when the fluoropolymer contains fluorine within a range of about 60 wt % to about 70 wt %.

The lift-off layer 120 may be formed on the substrate 100 by using an application method, a printing method, or a deposition method. When the lift-off layer 120 is formed by the application method or the printing method, a patterning process may be performed after performing a hardening process and a polymerization process, if desired.

The lift-off layer 120 may be formed to a thickness of 0.2 μm to 5 μm. If the lift-off layer 120 is too thick, a time taken to melt the lift-off layer 120 for performing the patterning increases, thereby increasing a time for performing the manufacturing processes. If the lift-off layer 120 is too thin, it is difficult to lift off the lift-off layer 120.

Figure 4B:
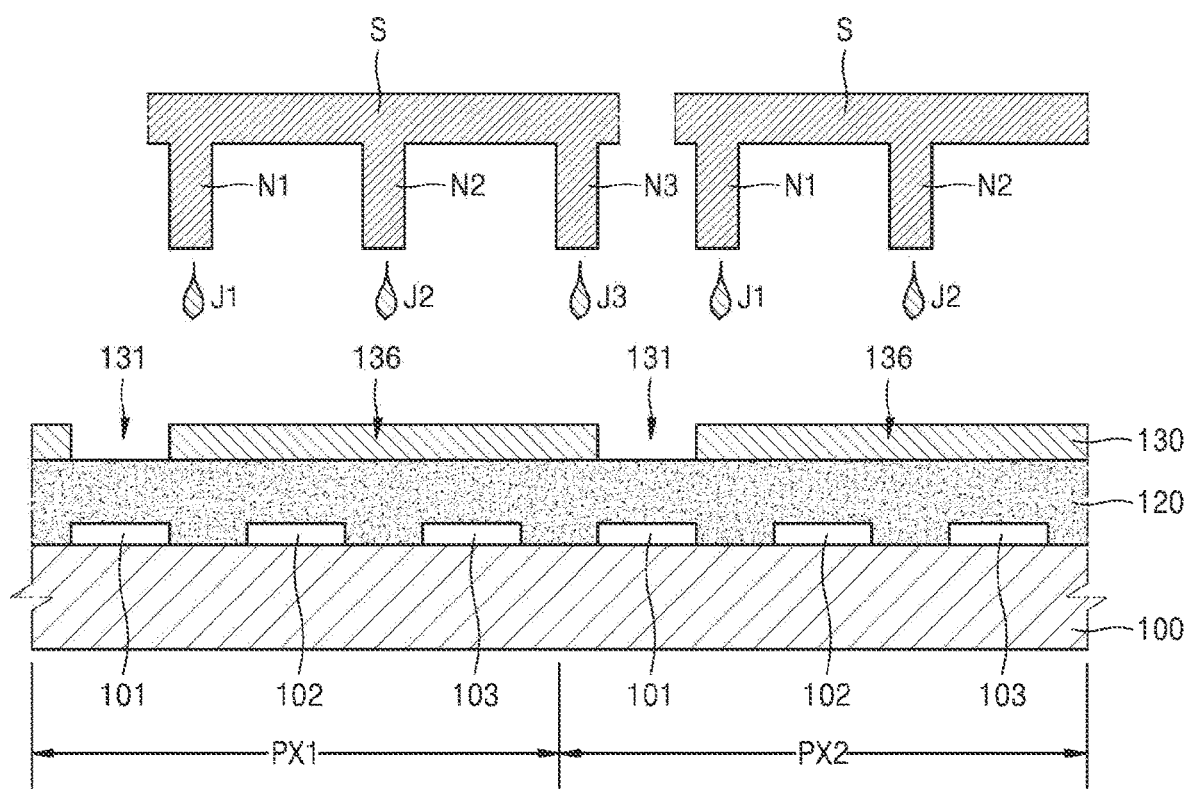

Referring to FIG. 4B, a pattern layer 130 having a shape (e.g., a set or predetermined shape) is formed on the lift-off layer 120.

The pattern layer 130 may not be formed at (e.g., on) a first region 131 corresponding to the first anode 101, but may be formed at (e.g., on) a remaining region 136 except the first region 131.

The pattern layer 130 may include a material having a greater surface energy than that of the lift-off layer 120.

In an embodiment, the pattern layer 130 may include a non-fluorine based polymer. For example, the pattern layer 130 may include a composite in which a binder material not containing fluorine, such as an acryl-based resin, a styrene-based resin, a novolac resin, and/or a silicon resin, is melted in a non-fluorine based general organic solvent.

In another embodiment, the pattern layer 130 may include a material containing a small amount of fluorine. For example, the pattern layer 130 may include a composite, in which a fluorine-based polymer containing less than 20 wt % of fluorine is melted in a non-fluorine based general organic solvent.

The pattern layer 130 may be formed by a printing method.

FIG. 4B shows an example in which the pattern layer 130 is printed on the lift-off layer 120 by directly dropping droplets J1, J2, and J3 from an inkjet printing device S including a plurality of nozzles N1, N2, and N3.

FIG. 4B illustrates that the droplets J1, J2, and J3 are concurrently (e.g., simultaneously) dropped onto first and second pixel regions PX1 and PX2 from the inkjet printing device S to form the pattern layer 130, but the inventive concept is not limited thereto. For example, the inkjet printing device S may form the pattern layer 130 first on the first pixel region PX1, and then may move to the second pixel region PX2 to form the pattern layer 130. Also, the number, size, and shape of the nozzles provided in the inkjet printing device S may be varied, and an injecting speed of the droplets dropped from the nozzles may be adjusted.

In a case where the pattern layer 130 of the set or predetermined shape is directly formed on the lift-off layer 120 by the printing method, because the lift-off layer 120 including the fluoropolymer has low surface energy, the pattern layer 130 does not spread over the lift-off layer 120 but maintains or substantially maintains a set or predetermined pattern, even when the pattern layer 130 including the non-fluorine based resin or the polymer containing a small amount of fluorine is directly printed on the lift-off layer 120.

If the pattern layer 130 is formed by a photolithography method, a photoresist is applied on the lift-off layer 120, the photoresist is exposed via a photomask by using an exposure device, and the exposed photoresist is developed and stripped. Accordingly, when using the photolithography method, complicated manufacturing processes are performed. However, according to an embodiment, the non-fluorine based polymer may be a general polymer that is not expensive, and thus, may cost less than the photoresist. In addition, when the photolithography method is performed, an expensive apparatus is used and complicated manufacturing processes are performed. However, the printing method according to an embodiment may use a simplified device and may perform straightforward manufacturing processes, and accordingly, equipment investment costs and processing costs may be reduced. Also, when the photolithography process is performed, the pattern layer 130 may be partially lost through the exposure, developing, and stripping processes, whereas the printing method according to an embodiment may directly form the pattern layer 130 on a region where the pattern is to be formed (e.g., the region 136, except the first region 131), and thus, loss of material may be prevented or reduced, and manufacturing costs may be reduced.

Although not shown in FIG. 4B, after performing the printing process of the pattern layer 130, a process of drying the pattern layer 130 may be performed. After printing the pattern layer 130, a temperature and a time for drying the pattern layer 130 may be dependent upon a glass transition temperature Tg of the fluoropolymer included in the lift-off layer 120, a boiling point of the solvent included in the lift-off layer 120, and/or a wet film thickness. In an embodiment, under a condition where the glass transition temperature Tg of the fluoropolymer is about 75° C., the boiling point of the solvent (e.g., PGMEA) is about 150° C., and the wet film thickness after the printing process is about 10 μm, the pattern layer 130 is dried for about 3 to 6 minutes at a temperature of about 70° C. to about 80° C.

Figure 4C:
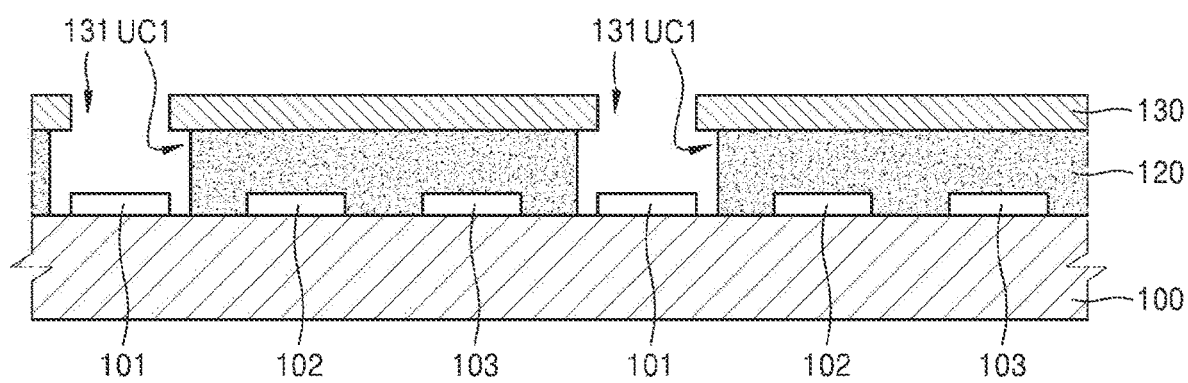

Referring to FIG. 4C, the lift-off layer 120 is etched by using the pattern layer 130 formed by the process illustrated in FIG. 4B as an etching mask.

An etchant may be a first solvent including fluorine. Because the lift-off layer 120 includes the fluoropolymer and the pattern layer 130 includes the non-fluorine based polymer, the pattern layer 130 may function as the etching mask during the etching process using the first solvent including the fluorine.

The first solvent may include hydrofluoroether. The hydrofluoroether is an electrochemically stabilized material that rarely interacts with other materials, and is also an eco-friendly material having a low global warming potential (GWP) and a low toxicity.

Through the etching process, the lift-off layer 120 formed on a location corresponding to the first region 131, that is, on the first anode 101, is etched.

When the lift-off layer 120 is etched, the first solvent including the fluorine forms a first undercut profile UC1 in the lift-off layer 120 under an interface between the pattern layer 130 and the first region 131.

The first undercut profile UC1 may allow a first organic functional layer 151 to be precisely deposited in a deposition process that will be described later, and may remove the lift-off layer 120 remaining on the substrate 100 clearly in a lift-off process that will be described later.

Figure 4D:
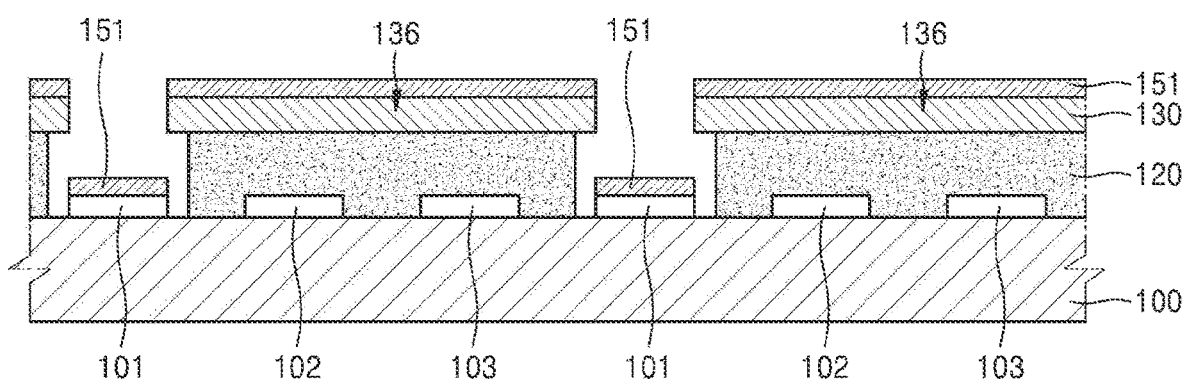

Referring to FIG. 4D, the first organic functional layer 151 including a first organic emission layer is formed on the structure shown in FIG. 4C.

The first organic functional layer 151 may further include a hole injection layer, a hole transport layer, an electron transport layer, and/or an electron injection layer.

In an embodiment, the first organic emission layer is used as an example of the first organic function layer 151. Hereinafter, the first organic functional layer and the first organic emission layer may be denoted by the same reference numeral.

The first organic functional layer 151 may be formed by a vacuum deposition process. In the deposition process, the lift-off layer 120 and the pattern layer 130 function as a mask. A part of the first organic emission layer 151 is formed over the first anode 101, and another part of the first organic emission layer 151 is formed on the other region 136 of the pattern layer 130, except the first region 131.

Figure 4E:
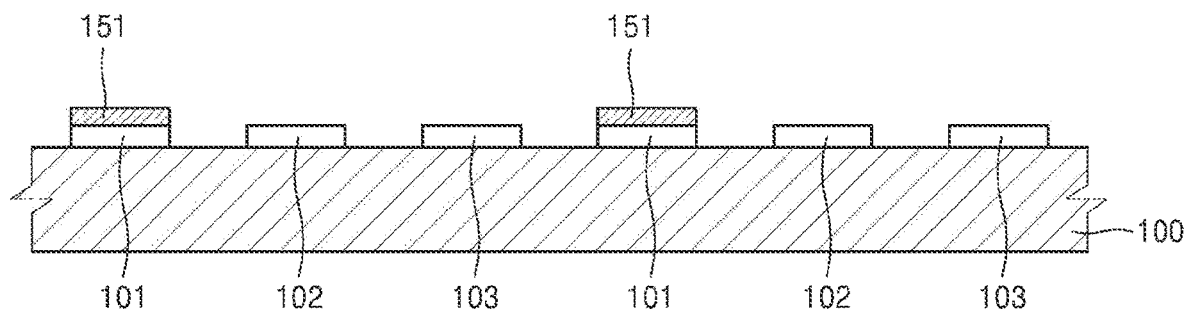

Referring to FIG. 4E, a lift-off process is performed on the structure shown in FIG. 4D.

Because the lift-off layer 120 includes the fluoropolymer, a second solvent including fluorine is used in the lift-off process. In addition, because the lift-off process is performed after forming the first organic emission layer 151, the second solvent may include a material having a low degree of reactivity with the first organic emission layer 151. The second solvent may include, for example, hydrofluoroether like the first solvent.

By lifting off the lift-off layer 120 formed under the region 136 (see FIG. 4D) of the pattern layer 130, the first organic layer 151 formed on the region 136 (see FIG. 4D) of the pattern layer 130 is removed, and the first organic emission layer 151 formed on the first anode 101 remains as a pattern.

Figure 11A:
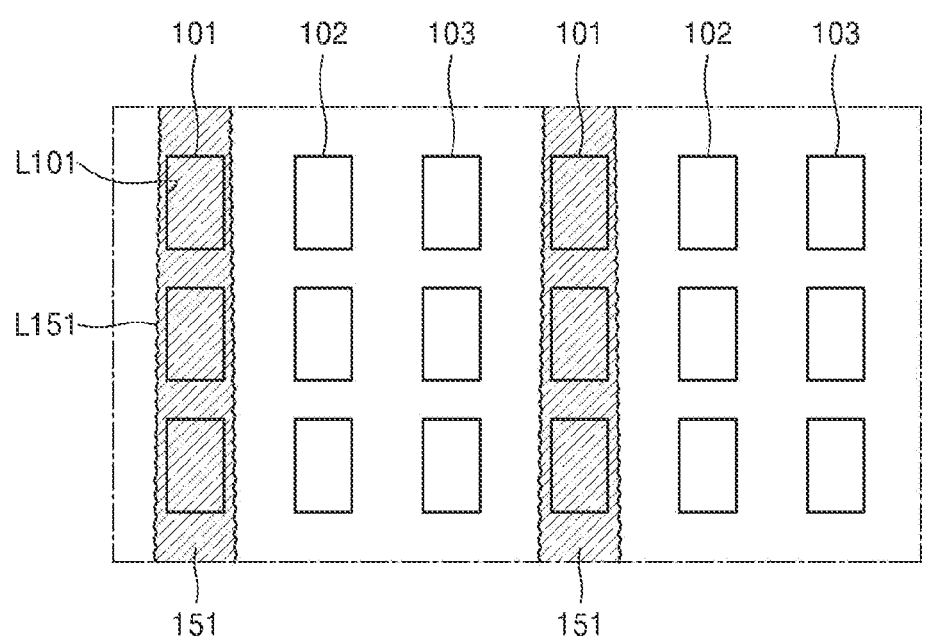
FIGS. 11A-11C are schematic diagrams showing states in which boundary lines of corresponding organic layers are irregularly formed after finishing corresponding unit processes.

FIG. 11A is a schematic diagram of boundary lines L151 of the first organic emission layer, which are irregularly formed, after finishing a first unit process. The pattern layer 130 (see FIG. 4D) formed on the lift-off layer 120 (see FIG. 4D) having a low surface energy has poor spreadability, and thus, boundary lines of the pattern layer 130 (see FIG. 4D) are not uniform, but irregularly formed. Because the pattern layer 130 (see FIG. 4D) functions as a deposition mask, the irregular shape of the boundary lines of the pattern layer 130 may affect the pattern of the first organic emission layer 151. Therefore, the boundary lines L151 of the first organic emission layer 151 are irregularly formed while generating fine waves. The boundary lines L151 of the first organic emission layer 151 may be more irregular than the boundary lines L101 of the first anode 101 formed by the photolithography method.

According to an embodiment, in the process of forming the first organic emission layer 151, a metal mask having openings is not used, but the lift-off process is performed. Thus, misalignment between the substrate 100 and the metal mask may be prevented.

After performing the first unit process, a second unit process for forming a second organic emission layer 152 (e.g., see FIG. 5E) for emitting light of a different color from that of the first organic emission layer 151 is performed on a region where the second anode 102 is located. Hereinafter, the second unit process will be described in more detail below with reference to FIGS. 5A to 5E.

Figure 5A:
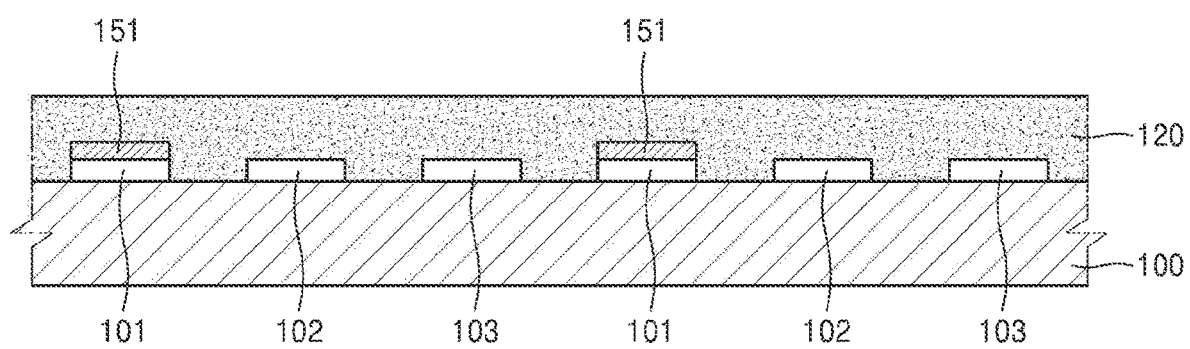
FIGS. 5A-5E are schematic cross-sectional views illustrating a second unit process in the method of FIG. 1 according to an embodiment.

Referring to FIG. 5A, the lift-off layer 120 including fluoropolymer is formed over the substrate 100, on which the first to third anodes 101, 102, and 103 are formed.

The lift-off layer 120 may include a material that is the same as or different from the fluoropolymer used in the first unit process. The lift-off layer 120 may be formed on the substrate 100 by an application method, a printing method, or a deposition method.

Figure 5B:
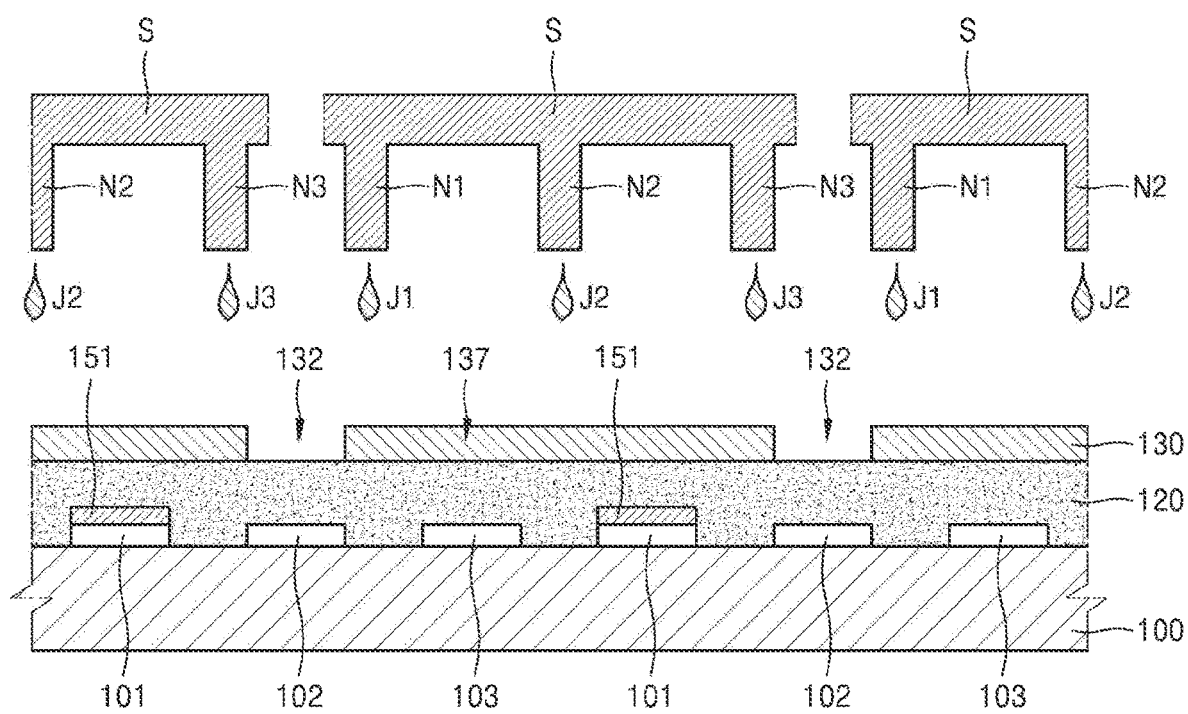

Referring to FIG. 5B, the pattern layer 130 is formed on the lift-off layer 120.

The pattern layer 130 including a non-fluorine based polymer is not formed at (e.g., on) a second region 132 corresponding to the second anode 102, but is directly formed at (e.g., on) a region 137 other than the second region 132 by dropping droplets J1, J2, and J3 from an inkjet printing device S including the plurality of nozzles N1, N2, and N3.

A process of drying the pattern layer 130 may be further performed after the printing process of the pattern layer 130.

Figure 5C:
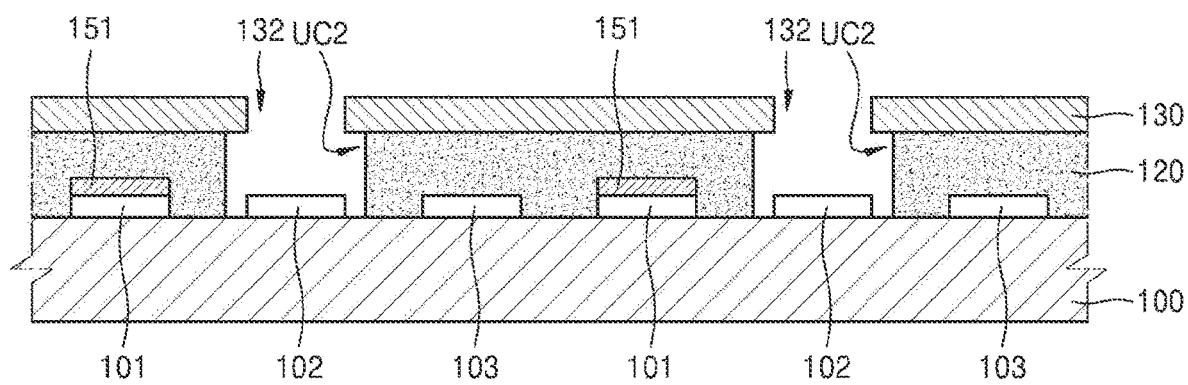

Referring to FIG. 5C, the lift-off layer 120 is etched by using the pattern layer 130 of a set or predetermined shape formed by the printing process illustrated with reference to FIG. 5B as an etching mask.

An etchant may be the first solvent including fluorine. Because the lift-off layer 120 includes the fluoropolymer and the pattern layer 130 includes the non-fluorine based polymer, the pattern layer 130 may function as an etching mask in the etching process using the first solvent including the fluorine.

The first solvent may include hydrofluoroether. Otherwise, the first solvent may include a different material from that of the first unit process described above.

According to the etching process, the lift-off layer 120 corresponding to the second region 132, that is, the lift-off layer 120 formed on the second anode 102, is etched.

In addition, when the lift-off layer 120 is etched, the first solvent including the fluorine forms a second undercut profile UC2 in the lift-off layer 120 under a boundary of the second region 132.

Figure 5D:
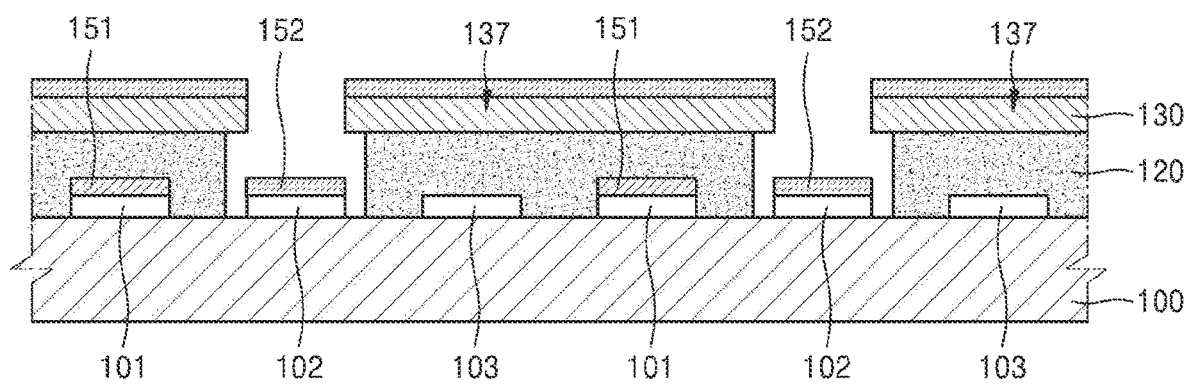

Referring to FIG. 5D, a second organic functional layer 152 including a second organic emission layer is formed over a structure shown in FIG. 5C.

The second organic functional layer 152 may further include at least one of a hole injection layer, a hole transport layer, an electron transport layer, and an electron injection layer.

In an embodiment, the second organic emission layer is described as an example of the second organic functional layer 152. Hereinafter, the second organic functional layer and the second organic emission layer may be denoted by the same reference numeral.

The second organic emission layer 152 may be formed by a vacuum deposition process. In the deposition process, the lift-off layer 120 and the pattern layer 130 may function as a mask. A part of the second organic emission layer 152 is formed on the second anode 102, and another part of the second organic emission layer 152 is formed on the region 137 other than the second region 132 in the pattern layer 130.

Figure 5E:
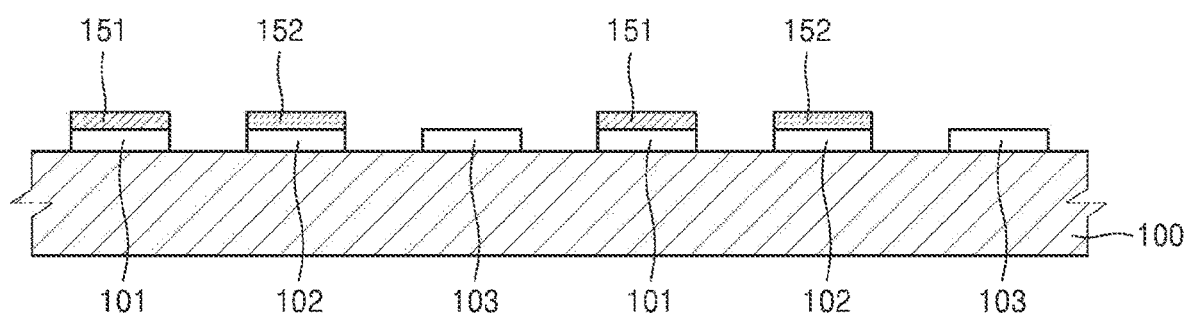

Referring to FIG. 5E, a lift-off process is performed on the structure shown in FIG. 5D.

Because the lift-off layer 120 includes the fluoropolymer, a second solvent including fluorine is used in the lift-off process. In addition, because the lift-off process is performed after forming the second organic emission layer 152, the second solvent may include a material having a low degree of reactivity with the second organic emission layer 152. The second solvent may include, for example, hydrofluoroether like the first solvent.

By lifting off the lift-off layer 120 formed under the region 137 (see FIG. 5D) of the pattern layer 130, the second organic emission layer 152 formed on the region 137 (see FIG. 5D) of the pattern layer 130 is removed, and the second organic emission layer 152 formed on the second anode 102 remains as a pattern.

Figure 11B:
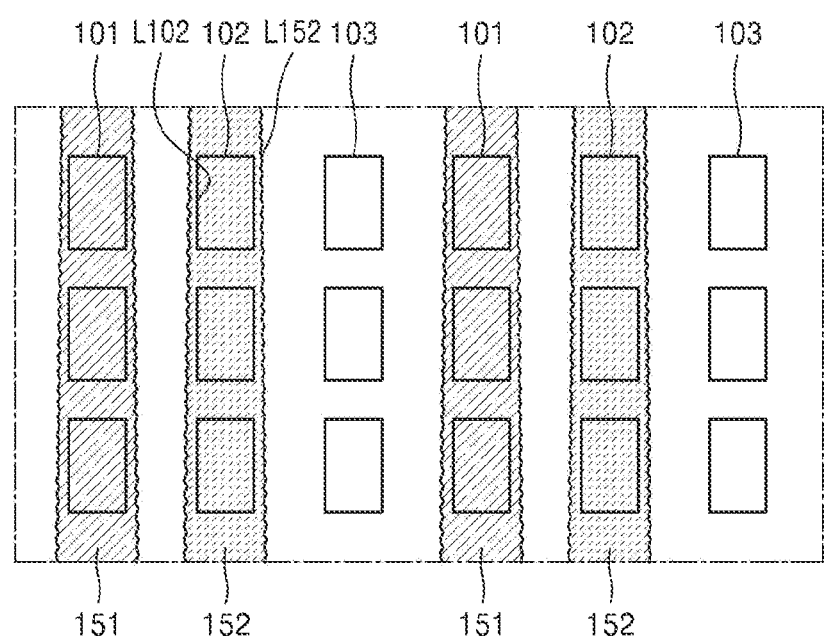

FIG. 11B is a schematic diagram showing a state, in which boundary lines L152 of the second organic emission layer 152 are irregularly formed after finishing the second unit process. Because the pattern layer 130 (see FIG. 5D) formed on the lift-off layer 120 (see FIG. 5D) having a low surface energy has poor spreadability, boundary lines of the pattern layer 130 (see FIG. 5D) are not uniform, but are irregularly formed. Because the pattern layer 130 (see FIG. 5D) functions as a deposition mask, the irregular shape of the boundary lines of the pattern layer 130 affects the pattern of the second organic emission layer 152. Therefore, boundary lines L152 of the second organic emission layer 152 are irregularly formed as, for example, fine waves. The boundary lines L152 of the second organic emission layer 152 may be formed to be more irregular than the boundary lines L102 of the second anode 102 that is formed by the photolithography method.

After performing the second unit process described above, a third unit process for forming a third organic emission layer 153 (e.g., see FIG. 6E) for emitting light of a different color from those of the first and second organic emission layers 152 and 152 is performed. Hereinafter, the third unit process will be described below with reference to FIGS. 6A through 6E.

Figure 6A:
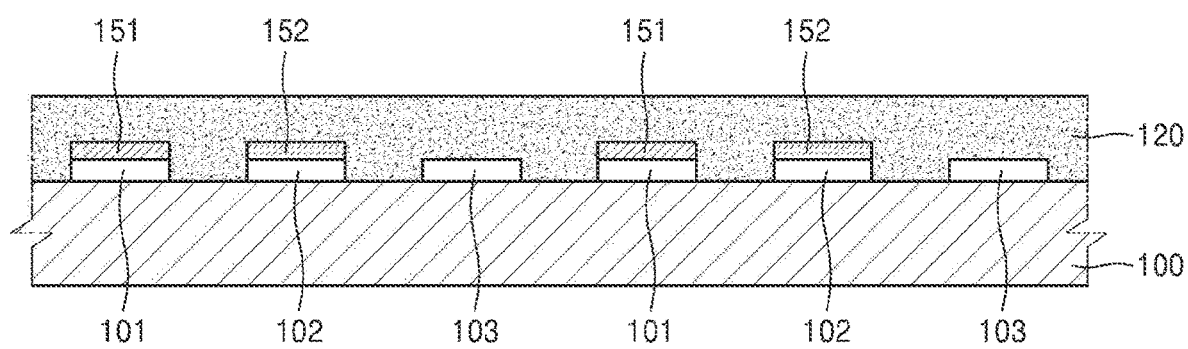
FIGS. 6A-6E are schematic cross-sectional views illustrating a third unit process in the method of FIG. 1 according to an embodiment.

Referring to FIG. 6A, the lift-off layer 120 including fluoropolymer is formed over the substrate 100 on which the first to third anodes 101, 102, and 103 are formed.

The lift-off layer 120 may include a material that is the same as or different from the fluoropolymer used in the first unit process and/or the second unit process. The lift-off layer 120 may be formed on the substrate 100 by an application method, a printing method, or a deposition method.

Figure 6B:
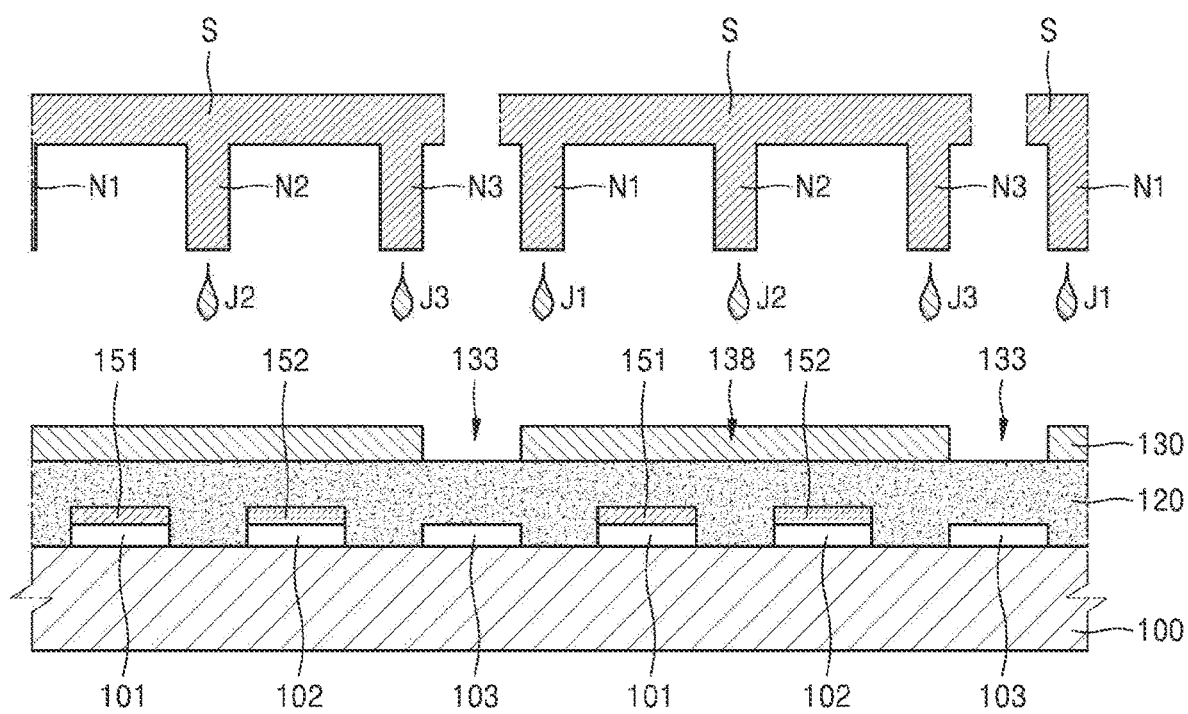

Referring to FIG. 6B, the pattern layer 130 is formed on the lift-off layer 120.

The pattern layer 130 including a non-fluorine based polymer is not formed at (e.g., on) a third region 133 corresponding to the third anode 103, but is directly formed at (e.g., on) a region 138 other than the third region 133, by dropping droplets J1, J2, and J3 from the inkjet printing device S including the plurality of nozzles N1, N2, and N3.

A process for drying the pattern layer 130 may be further performed after the printing process of the pattern layer 130.

Figure 6C:
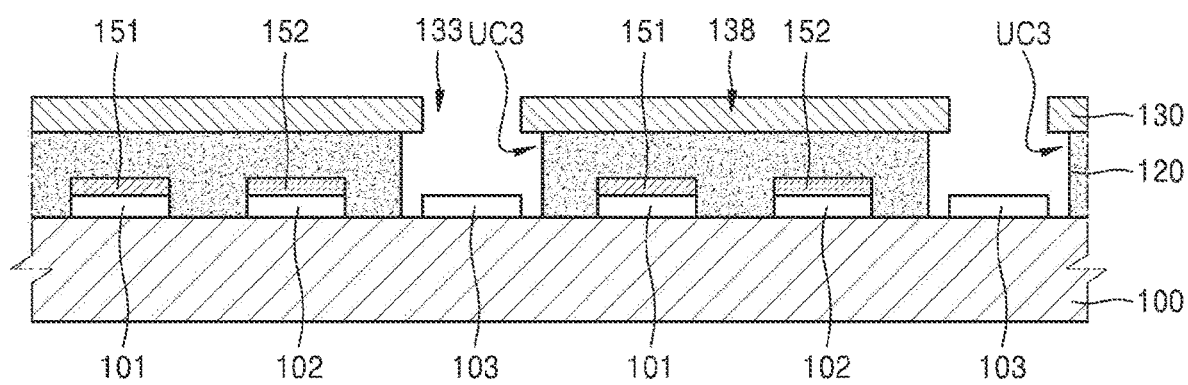

Referring to FIG. 6C, the lift-off layer 120 is etched by using the pattern layer 130 having a set or predetermined shape formed by the printing method illustrated in FIG. 6B as an etching mask.

An etchant may include the first solvent including fluorine. Because the lift-off layer 120 includes the fluoropolymer and the pattern layer 130 includes the non-fluorine based polymer, the pattern layer 130 may function as the etching mask in the etching process using the first solvent including the fluorine.

The first solvent may include hydrofluoroether, like in the first unit process and/or the second unit process. The first solvent may include a material different from those of the first unit process and the second unit process.

Due to the etching process, the lift-off layer 120 corresponding to the third region 133, that is, the lift-off layer 120 formed on the third anode 103, is etched.

In addition, when the lift-off layer 120 is etched, the first solvent including the fluorine forms a third undercut profile UC3 in the lift-off layer 120 under a boundary surface of the third region 133 in the pattern layer 130.

Figure 6D:
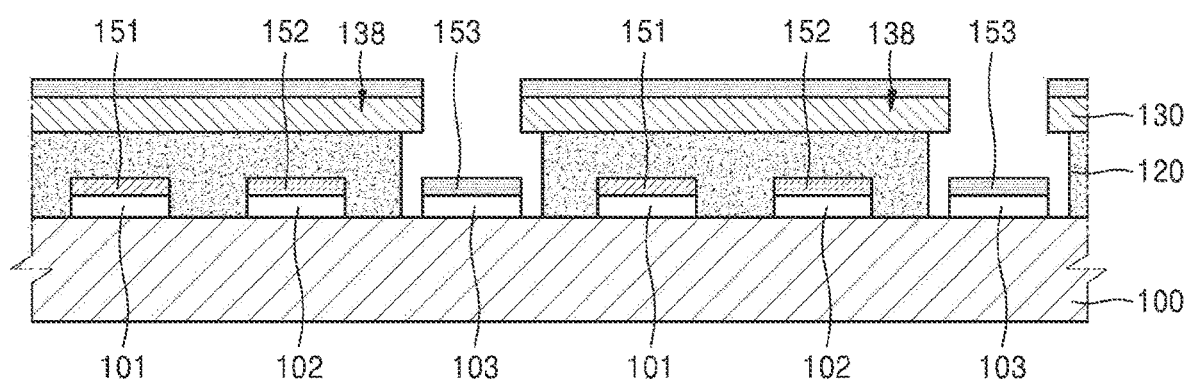

Referring to FIG. 6D, a third organic functional layer 153 including a third organic emission layer is formed on the structure shown in FIG. 6C.

The third organic functional layer 153 may further include at least one of a hole injection layer, a hole transport layer, an electron transport layer, and an electron injection layer.

In an embodiment, the third organic emission layer is described as an example of the third organic functional layer 153. Hereinafter, the third organic functional layer and the third organic emission layer may be denoted by the same reference numeral.

The third organic emission layer 153 may be formed by a vacuum deposition process. In the deposition process, the lift-off layer 120 and the pattern layer 130 may function as a mask. A part of the third organic emission layer 153 is formed on the third anode 103, and another part of the third organic emission layer 153 is formed on a region 138 other than the third region 133 in the pattern layer 130.

Figure 6E:
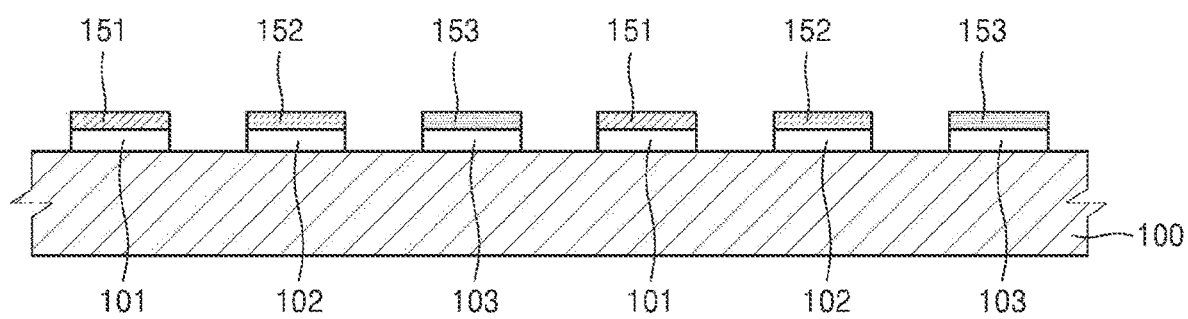

Referring to FIG. 6E, a lift-off process is performed on the structure shown in FIG. 6D.

Because the lift-off layer 120 includes the fluoropolymer, the second solvent including the fluorine is used in the lift-off process. In addition, since the lift-off process is performed after forming the third organic emission layer 153, the second solvent may include a material having a low degree of reactivity with the third organic emission layer 153. The second solvent may include hydrofluoroether, like the first solvent.

By lifting off the lift-off layer 120 formed under the region 138 (see FIG. 6D) of the pattern layer 130, the third organic emission layer 153 formed on the region 138 (see FIG. 6D) of the pattern layer 130 is removed, and the third organic emission layer 153 formed on the third anode 103 remains as a pattern.

Figure 11C:
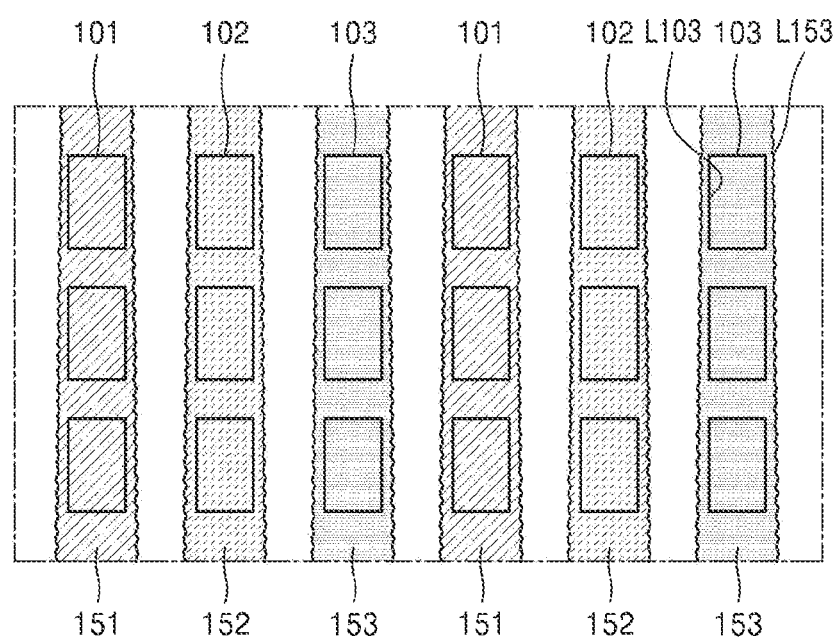

FIG. 11C is a schematic diagram showing a state in which boundary lines L153 of the third organic emission layer 153 are irregularly formed after finishing the third unit process. Because the pattern layer 130 (see FIG. 6D) formed on the lift-off layer 120 (see FIG. 6D) having a low surface energy has poor spreadability, boundary lines of the pattern layer 130 (see FIG. 6D) are not uniform, but are irregularly formed. Because the pattern layer 130 (see FIG. 6D) functions as a deposition mask, the irregular shape of the boundary lines of the pattern layer 130 affects the pattern of the third organic emission layer 153. Therefore, boundary lines L153 of the third organic emission layer 153 are irregularly formed as, for example, fine waves. The boundary lines L153 of the third organic emission layer 153 may be formed to be more irregular than the boundary lines L103 of the third anode 103 that is formed by the photolithography method.

Referring back to FIG. 2, the first to third organic functional layers 151, 152, and 153 are formed through the first to third unit processes described above, respectively, and then, a cathode 180 is formed as a common layer.

In FIG. 2, the cathode 180 is shown as not integrally formed, but separately formed on the first to third anodes 101, 102, and 103. However, the inventive concept is not limited thereto, and in some embodiments, the cathode 180 may be integrally formed.

In an embodiment, the first to third anodes 101, 102, and 103 are described as hole injection electrodes, and the cathode 180 is described as an electron injection electrode, but the inventive concept is not limited thereto. That is, the electron injection electrodes may be formed on regions where the first to third anodes 101, 102, and 103 are located, and the hole injection electrode may be formed on a region where the cathode 180 is located.

The first to third organic emission layers 151, 152, and 153 may emit light of different colors from each other. The light emitted from the first to third organic emission layers 151, 152, and 153 may be mixed with each other to form white light. For example, the first to third organic emission layers 151, 152, and 153 may respectively emit red light, green light, and blue light. For example, the first to third organic emission layers 151, 152, and 153 may be sub-pixels configuring a unit pixel in the organic light-emitting display apparatus 1.

The organic light-emitting display apparatus 1 shown in FIG. 2 may denote one unit pixel (e.g., two one unit pixels). Also, the above described methods may be applied to an organic light-emitting display apparatus including a plurality of unit pixels as shown in FIG. 2. That is, a plurality of first organic emission layers 151 for emitting first color light may be formed concurrently (e.g., simultaneously) through the first unit process. A plurality of second organic emission layers 152 for emitting second color light may be concurrently (e.g., simultaneously) formed through the second unit process. A plurality of third organic emission layers 153 for emitting third color light may be concurrently (e.g., simultaneously) formed through the third unit process. Full-color light may be implemented through the first to third unit processes.

Figure 7:
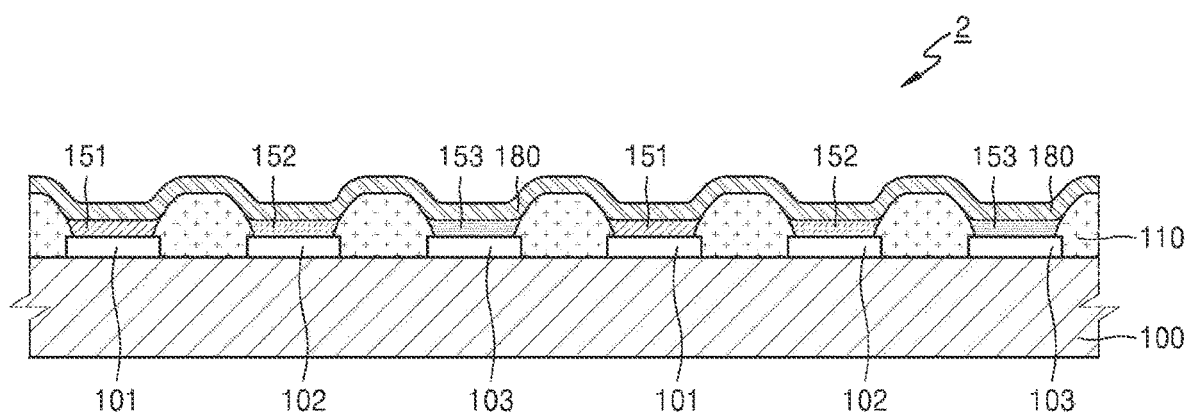
FIG. 7 is a schematic cross-sectional view of an organic light-emitting display apparatus manufactured by a manufacturing method according to an embodiment.

FIG. 7 is a schematic cross-sectional view of an organic light-emitting display apparatus 2 manufactured by a manufacturing method according to an embodiment.

The organic light-emitting display apparatus 2 illustrated with reference to FIG. 7 may be manufactured in a similar manner to that of the organic light-emitting display apparatus 1 of FIG. 2. Hereinafter, differences between the method for manufacturing the organic light-emitting display apparatus 1 of FIG. 2 and the method for manufacturing the organic light-emitting display apparatus 2 of FIG. 7 will be described in more detail below.

Referring to FIG. 7, a plurality of anodes including first to third anodes 101, 102, and 103 are formed on the substrate 100, and a pixel defining layer 110 is formed on the substrate 100 to surround edges of the first to third anodes 101, 102, and 103. The pixel defining layer 110 defines an emission area, and prevents or substantially prevents short-circuit between each of the first to third anodes 101, 102, and 103 and the cathode 180.

In an embodiment, first to third unit processes are performed after forming the first to third anodes 101, 102, and 103 and the pixel defining layer 110.

Through the first to third unit processes, the first to third organic emission layers 151, 152, and 153 are formed on the first to third anodes 101, 102, and 103, respectively. After performing the first to third unit processes, the cathode 180 is formed as a common layer.

The pixel defining layer 180 may be formed by a photolithography process. As in the above-described embodiments, because the pattern layer 130 (e.g., see FIGS. 4D, 5D, and 6D) functions as the deposition mask, the irregular shape at the boundary of the pattern layer 130 affects the patterns of the first to third organic functional layers 151, 152, and 153. Therefore, the boundary lines of the first to third organic functional layers 151, 152, and 153 may be more irregular than those of the first to third anodes 101, 102, and 103 and the pixel defining layer 110.

Figure 8:
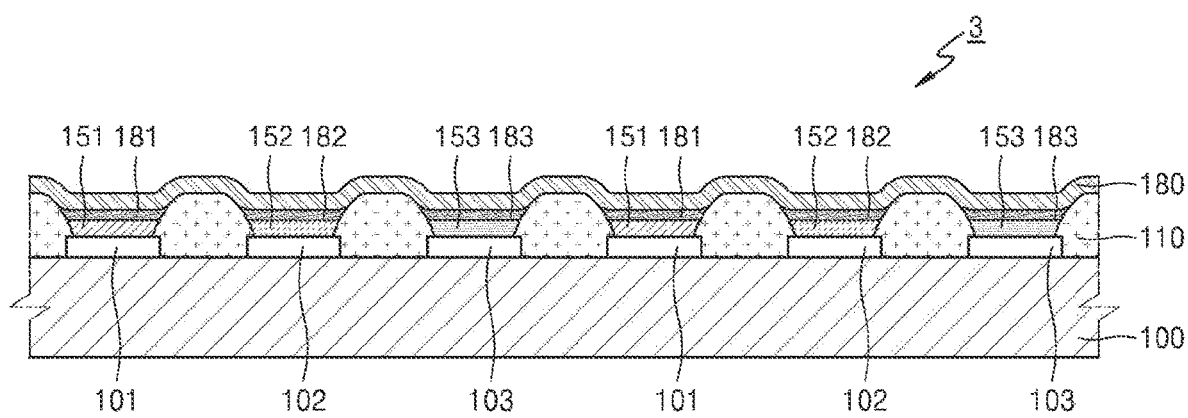
FIG. 8 is a schematic cross-sectional view of an organic light-emitting display apparatus manufactured by a manufacturing method according to an embodiment.

FIG. 8 is a schematic cross-sectional view of an organic light-emitting display apparatus 3 manufactured by a manufacturing method according to an embodiment.

The organic light-emitting display apparatus 3 of FIG. 8 may be manufactured in a similar manner to that of the organic light-emitting display apparatus 2 shown in FIG. 7 described above. Hereinafter, differences between the method of manufacturing the organic light-emitting display apparatus 2 illustrated with reference to FIG. 7 and the method of manufacturing the organic light-emitting display apparatus 3 illustrated with reference to FIG. 8 will be described below.

Referring to FIG. 8, a plurality of anodes including first to third anodes 101, 102, and 103 are formed on the substrate 100, and a pixel defining layer 110 is formed on the substrate 100 to surround edges of the first to third anodes 101, 102, and 103. The pixel defining layer 110 defines an emission area, and prevents or substantially prevents short-circuit between each of the first to third anodes 101, 102, and 103 and the cathode 180.

In an embodiment, first to third unit processes are performed after forming the first to third anodes 101, 102, and 103 and the pixel defining layer 110.

In the first unit process, the lift-off layer 120 (e.g., see FIG. 4D) formed on the first anode 101 is etched by using the printing method and the etching process. Next, the first organic emission layer 151 is formed on the first anode 101 by a deposition process. When the first organic emission layer 151 is formed, a first auxiliary cathode 181 is formed successively on the first organic emission layer 151, and then, a lift-off process is performed.

In the lift-off process, a second solvent including fluorine is used. The second solvent including the fluorine may break the first organic emission layer 151. The first auxiliary cathode 181 functions as a barrier for protecting the first organic emission layer 151 during the lift-off process.

After performing the first unit process, the second unit process is performed. The lift-off layer 120 (e.g., see FIG. 5D) on the second anode 102 is etched by using the printing method and the etching process. Next, the second organic emission layer 152 is formed on the second anode 102 by a deposition process. When the second organic emission layer 152 is formed, a second auxiliary cathode 182 is successively formed on the second organic emission layer 152, and the lift-off process is performed.

In the lift-off process, the second solvent including fluorine is used. The second solvent may break the second organic emission layer 152. The second auxiliary cathode 182 functions as a barrier for protecting the second organic emission layer 152 during the lift-off process.

After the second unit process, the third unit process is performed. The lift-off layer 120 (e.g., see FIG. 6D) on the third anode 103 is etched by using the printing method and the etching process. Next, the third organic emission layer 153 is formed on the third anode 103 by a deposition process. When the third organic emission layer 153 is formed, a third auxiliary cathode 183 is successively formed on the third organic emission layer 153, and the lift-off process is performed.

In the lift-off process, a second solvent including fluorine is used. The second solvent including the fluorine may damage the third organic emission layer 153. The third auxiliary cathode 183 functions as a barrier for protecting the third organic emission layer 183 during the lift-off process.

After performing the first to third unit processes, the cathode 180 is formed as a common layer.

According to a manufacturing method illustrated with reference to FIG. 8, when the first to third organic emission layers 151, 152, and 153 are formed, the first to third auxiliary cathodes 181, 182, and 183 are successively formed on the first to third organic emission layers 151, 152, and 153, respectively, in order to prevent or reduce damage to the first to third organic emission layers 151, 152, and 153 in the post lift-off process. Thereafter, the first to third auxiliary cathodes 181, 182, and 183 are electrically connected to the cathode 180 that is commonly formed throughout the plurality of pixels after the first to third unit processes, in order to prevent or reduce a voltage dropping of the cathode 180.

Figure 9A:
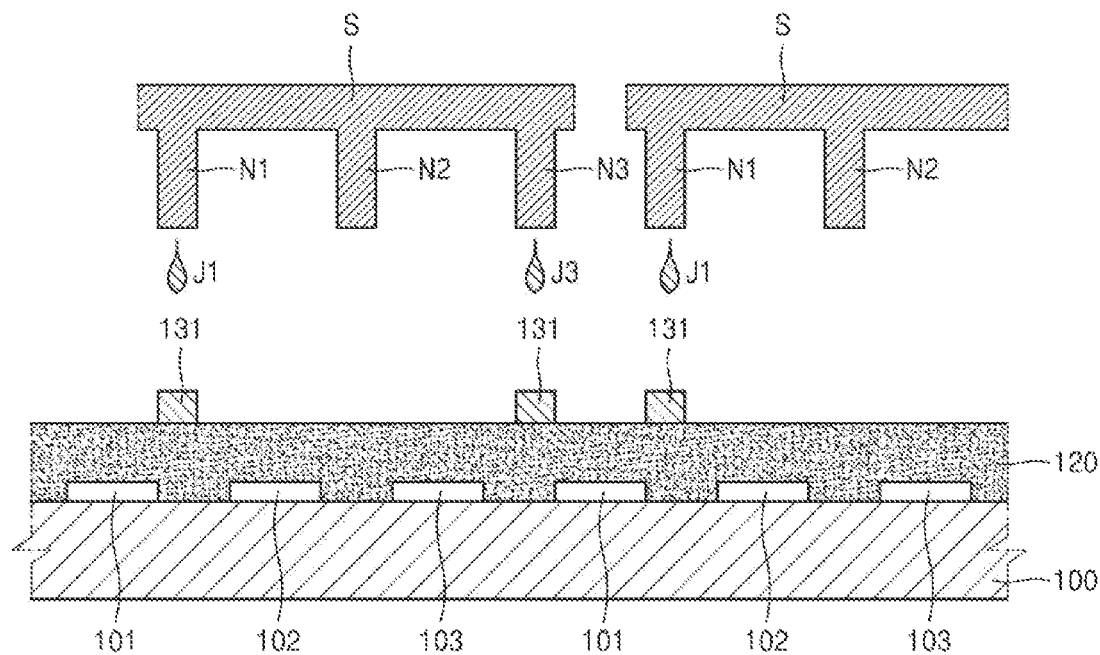
FIGS. 9A-9B are schematic cross-sectional views illustrating a method of forming a pattern layer, according to an embodiment.
Figure 9B:
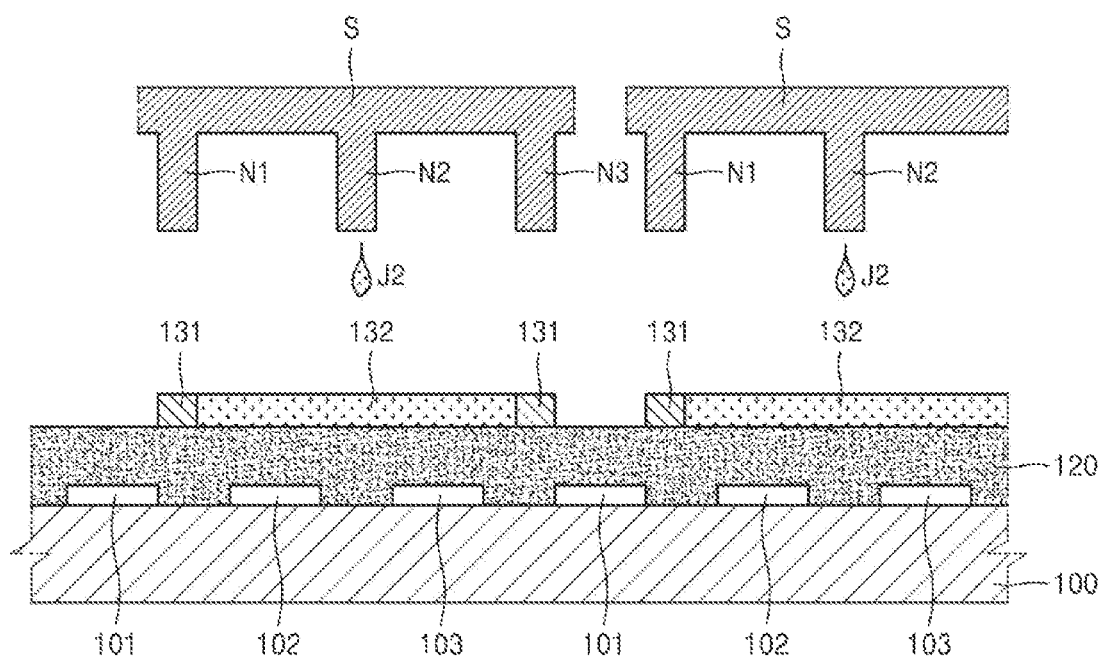

FIGS. 9A and 9B are schematic cross-sectional views of a method of forming a pattern layer according to an embodiment.

In FIG. 9A, a first pattern layer 131 is formed on the lift-off layer 120 by dropping droplets J1 and J3 including a material having a greater surface energy than that of the lift-off layer 120 from the inkjet printing device S including the plurality of nozzles N1, N2, and N3.

In FIG. 9B, a second pattern layer 132 is formed on the lift-off layer 120 by dropping a droplet J2 including a material having a smaller surface energy than that of the first pattern layer 131 from the inkjet printing device S including the plurality of nozzles N1, N2, and N3.

Referring to FIGS. 9A and 9B, the first pattern layer 131 including the material having the greater surface energy than that of the lift-off layer 120 is formed first, and then the second pattern layer 132 including the material having the smaller surface energy than that of the first pattern layer 131 is formed thereafter.

The first pattern layer 131 includes a non-fluorine based polymer, and the second pattern layer 132 may include a material, in which a fluorine-based surfactant is added to the non-fluorine based polymer material of the first pattern layer 131. For example, the second pattern layer 132 may include non-ionic polymeric fluorosurfactant.

The first pattern layer 131 having the greater surface energy may surround the second pattern layer 132 having the smaller surface energy.

As in one or more of the above-described embodiments, when the pattern layer 130 (e.g., see FIG. 4B) of a set or predetermined shape is directly formed on the lift-off layer 120 by the printing method, even if the pattern layer 130 including the non-fluorine based resin or the polymer having a small amount of fluorine is directly printed on the lift-off layer 120, the pattern layer 130 does not spread over the lift-off layer 120, but maintains or substantially maintains a set or predetermined pattern, because the lift-off layer 120 including the fluoropolymer has a low surface energy. However, because the pattern layer 130 does not spread, uniformity of the pattern layer 130 degrades.

However, since the first pattern layer 131 having a high surface energy is formed according to the method illustrated in FIGS. 9A and 9C, the uniformity of the pattern layer may be improved, and a pin hole defect that may occur in a surface of the pattern layer may be prevented or reduced.

Figure 10:
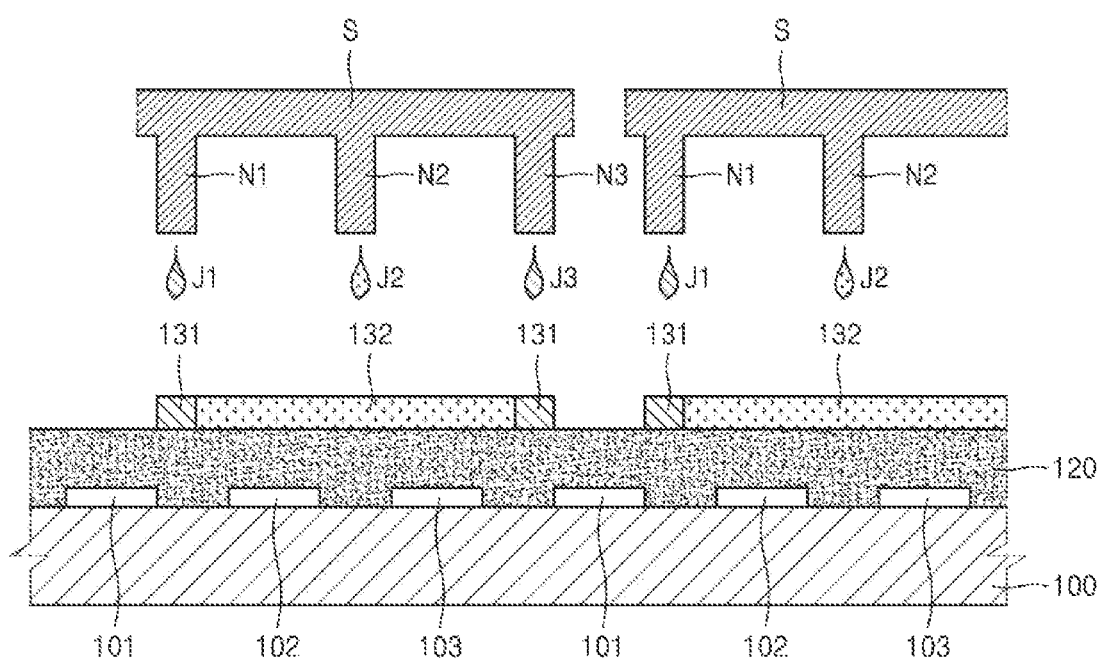
FIG. 10 is a schematic cross-sectional view illustrating a method of forming a pattern layer, according to an embodiment.

FIG. 10 is a schematic cross-sectional view of a method of forming a pattern layer according to an embodiment.

FIG. 10 illustrates that the first pattern layer 131 and the second pattern layer 132 are concurrently (e.g., simultaneously) formed on the lift-off layer 120 by using the inkjet printing device S including the plurality of nozzles N1, N2, and N3. For example, droplets J1 and J3 including a material having a large surface energy are dropped via the nozzles N1 and N3 to form the first pattern layer 131, and concurrently (e.g., simultaneously or at the same time), a droplet J2 including a material having a small surface energy is dropped via the nozzle N2 to form the second pattern layer 132. Thus, processing speed may be faster than that of the method illustrated in FIGS. 9A and 9B.

In addition, although not shown in the drawings, one or more of the organic light-emitting display apparatuses described above may further include an encapsulation member for encapsulating the organic emission layer. The encapsulation member may include a glass substrate, a metal foil, or a thin film encapsulation layer in which an inorganic layer and an organic layer are mixed.

According to the one or more embodiments, an organic light-emitting display apparatus may be manufactured through straightforward manufacturing processes, and a misalignment between the patterns may be prevented or substantially prevented. Also, costs for providing equipment and performing manufacturing processes, and material costs, may be reduced, and thus, manufacturing costs may be reduced.

It should be understood that embodiments described herein should be considered in a descriptive sense only, and not for purposes of limitation. Descriptions of features and/or aspects within each embodiment should typically be considered as available for other similar features and/or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:

1. An organic light-emitting display apparatus comprising:
   a substrate;
   a plurality of first thin film transistors and a plurality of second thin film transistors arranged on the substrate;
   a plurality of first anodes on the substrate, the plurality of first anodes being spaced apart from each other along a first direction, and each of the plurality of first anodes being electrically connected to a corresponding one of the plurality of first thin film transistors;
   a plurality of second anodes on the substrate, the plurality of second anodes being spaced apart from the plurality of first anodes in a second direction that intersects with the first direction, the plurality of second anodes being spaced apart from each other along the first direction, and each of the plurality of second anodes being electrically connected to a corresponding one of the plurality of second thin film transistors;
   a pixel defining layer surrounding edges of both the plurality of first anodes and the plurality of second anodes;
   a first organic functional layer continuously arranged in the first direction on the plurality of first anodes and on the pixel defining layer between the plurality of first anodes, the first organic functional layer comprising a first emission layer;
   a second organic functional layer continuously arranged in the first direction on the plurality of second anodes and on the pixel defining layer between the plurality of second anodes, the second organic functional layer comprising a second emission layer;
   a first auxiliary cathode on the first organic functional layer; and
   a second auxiliary cathode on the second organic functional layer,
   wherein the first auxiliary cathode is spaced apart from the second auxiliary cathode in the second direction.

2. The organic light-emitting display apparatus of claim 1, wherein the first organic functional layer is spaced apart from the second organic functional layer in the second direction.

3. The organic light-emitting display apparatus of claim 2, wherein in a plan view, the first organic functional layer is arranged substantially parallel to the second organic functional layer.

4. The organic light-emitting display apparatus of claim 2, wherein in a plan view, each of the first and second organic functional layers has two boundary lines extending in the first direction.

5. The organic light-emitting display apparatus of claim 4, wherein each of the two boundary lines has a wavy shape.

6. The organic light-emitting display apparatus of claim 2, wherein in a plan view, each of the first and second organic functional layers has a first width and a second width smaller than the first width, the first width is a width of each of the first and second organic functional layers along the first direction, and the second width is a width of each of the first and second organic functional layers along the second direction.

7. The organic light-emitting display apparatus of claim 1, wherein each of the first and second organic functional layers further comprises a hole injection layer, a hole transport layer, an electron transport layer, and/or an electron injection layer.

8. The organic light-emitting display apparatus of claim 1, wherein the first emission layer comprises a first organic emission layer, the second emission layer comprises a second organic emission layer, and a first color emitted from the first emission layer is different from a second color emitted from the second emission layer.

9. The organic light-emitting display apparatus of claim 8, further comprising:
   a plurality of third thin film transistors arranged on the substrate;
   a plurality of third anodes on the substrate, the plurality of third anodes being spaced apart from each of the plurality of first and second anodes in the second direction, the plurality of third anodes being spaced apart from each other along the first direction, and each of the plurality of third anodes being electrically connected to a corresponding one of the plurality of third thin film transistors;
   a third organic functional layer continuously arranged in the first direction on the plurality of third anodes and on the pixel defining layer between the plurality of third anodes, the third organic functional layer comprising a third emission layer; and
   a third auxiliary cathode on the third organic functional layer, the third auxiliary cathode being spaced apart from the first auxiliary cathode and the second auxiliary cathode in the second direction,
   wherein a third color emitted from the third emission layer is different from each of the first and second colors emitted from the first and second emission layers.

10. The organic light-emitting display apparatus of claim 9, wherein the first, second and third colors are mixed to generate white light.

11. The organic light-emitting display apparatus of claim 1, further comprising a second electrode integrally formed on the first and second auxiliary cathodes.

12. An organic light-emitting display apparatus comprising:
   a substrate;
   a plurality of first thin film transistors and a plurality of second thin film transistors arranged on the substrate;
   a plurality of first anodes on the substrate, the plurality of first anodes being spaced apart from each other along a first direction, and each of the plurality of first anodes being electrically connected to a corresponding one of the plurality of first thin film transistors;
   a plurality of second anodes on the substrate, the plurality of second anodes being spaced apart from the plurality of first anodes in a second direction that intersects with the first direction, and the plurality of second anodes being spaced apart from each other along the first direction, and each of the plurality of second anodes being electrically connected to a corresponding one of the plurality of second thin film transistors;
   a pixel defining layer surrounding edges of both the plurality of first anodes and the plurality of second anodes;
   a first organic functional layer continuously arranged in the first direction on the plurality of first anodes and on the pixel defining layer between the plurality of first anodes, the first organic functional layer comprising a first emission layer;
   a second organic functional layer continuously arranged in the first direction on the plurality of second anodes and on the pixel defining layer between the plurality of second anode, the second organic functional layer comprising a second emission layer; and
   a second electrode overlapping the first and second organic functional layers and the pixel defining layer,
   wherein the first organic functional layer is spaced apart from the second organic functional layer in the second direction.

13. The organic light-emitting display apparatus of claim 12, wherein in a plan view, the first organic functional layer is arranged substantially parallel to the second organic functional layer.

14. The organic light-emitting display apparatus of claim 12, wherein in a plan view, each of the first and second organic functional layers has two boundary lines extending in the first direction.

15. The organic light-emitting display apparatus of claim 14, wherein each of the two boundary lines has a wavy shape.

16. The organic light-emitting display apparatus of claim 12, wherein in a plan view, each of the first and second organic functional layers has a first width and a second width smaller than the first width, the first width is a width of each of the first and second organic functional layers along the first direction, and the second width is a width of each of the first and second organic functional layers along the second direction.

17. The organic light-emitting display apparatus of claim 12, wherein each of the first and second organic functional layers further comprises a hole injection layer, a hole transport layer, an electron transport layer, and/or an electron injection layer.

18. The organic light-emitting display apparatus of claim 12, wherein the first emission layer comprises a first organic emission layer, the second emission layer comprises a second organic emission layer, and a first color emitted from the first emission layer is different from a second color emitted from the second emission layer.

19. The organic light-emitting display apparatus of claim 18, further comprising:
   a plurality of third thin film transistors arranged on the substrate;
   a plurality of third anodes on the substrate, the plurality of third anodes being spaced apart from each of the plurality of first and second anodes in the second direction, the plurality of third anodes being spaced apart from each other along the first direction, each of the plurality of third anodes being electrically connected to a corresponding one of the plurality of third thin film transistors, and the pixel defining layer being around edges of the plurality of third anodes; and
   a third organic functional layer continuously arranged in the first direction on the plurality of third anodes and on the pixel defining layer between the plurality of third anodes, the third organic functional layer comprising a third emission layer,
   wherein the second electrode overlaps the third organic functional layer and the pixel defining layer around edges of the plurality of third anodes, wherein a third color emitted from the third emission layer is different from each of the first and second colors emitted from the first and second emission layers.

20. The organic light-emitting display apparatus of claim 19, wherein the first, second and third colors are mixed to generate white light.

* * * * *